United States Patent
Cheng et al.

(10) Patent No.: US 12,118,278 B1
(45) Date of Patent: Oct. 15, 2024

(54) DIFFERENCE ANALYSIS METHOD FOR 3D CAD MODELS BASED ON KEY-POINT MATCHING

(71) Applicant: ZHEJIANG UNIVERSITY, Zhejiang (CN)

(72) Inventors: Jin Cheng, Hangzhou (CN); Hao Lv, Hangzhou (CN); Zhenyu Liu, Hangzhou (CN); Jianrong Tan, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/503,188

(22) Filed: Nov. 7, 2023

(30) Foreign Application Priority Data

Mar. 31, 2023 (CN) .......................... 202310337386.4

(51) Int. Cl.
*G06F 30/20* (2020.01)
*G06F 30/12* (2020.01)

(52) U.S. Cl.
CPC .............. *G06F 30/20* (2020.01); *G06F 30/12* (2020.01)

(58) Field of Classification Search
CPC ................................ G06F 30/20; G06F 30/12
USPC .............................................................. 703/2
See application file for complete search history.

(56) References Cited

U.S. PATENT DOCUMENTS

| | | | |
|---|---|---|---|
| 9,881,388 B2 * | 1/2018 | Rorato | G06T 9/20 |
| 10,282,914 B1 * | 5/2019 | Tran | A61B 5/1036 |
| 10,659,768 B2 * | 5/2020 | Feng | H04N 13/204 |
| 10,820,172 B2 * | 10/2020 | Hu | G06T 7/73 |
| 11,238,711 B2 * | 2/2022 | Fernandez-Orellana | G08B 27/005 |
| 11,511,142 B2 * | 11/2022 | Fernandez-Orellana | A62C 37/00 |
| 11,670,047 B2 * | 6/2023 | Das | G06T 7/77 382/285 |
| 2006/0094951 A1 * | 5/2006 | Dean | G06T 17/10 600/407 |

(Continued)

FOREIGN PATENT DOCUMENTS

| | | |
|---|---|---|
| CN | 108132927 A | 6/2018 |
| CN | 111369607 A | 7/2020 |

OTHER PUBLICATIONS

Zhu et al. ("3D Cad model matching from 2D local invariant features", Computers in Industry 61 (2010) 432-439) (Year: 2010).*

(Continued)

*Primary Examiner* — Iftekhar A Khan
(74) *Attorney, Agent, or Firm* — W&G Law Group

(57) ABSTRACT

A difference analysis method for 3D CAD models based on key-point matching. According to the method, a 3D CAD model is firstly transformed into a key-point representation, then a graph representation and a graph matching method are introduced to establish a pre-matching of vertices between the two 3D CAD models, and rigid transformation parameters between the two 3D CAD models are obtained through a mismatch elimination method; and subsequently, a matching relationship of key-points is established by checking their distance after rigid transformation to obtain a key-point matching sequence for hierarchical comparison, so as to identify the differences between vertices, edges, faces and solid models, thereby quickly and accurately identifying the difference between the 3D CAD models.

3 Claims, 6 Drawing Sheets

(56) References Cited

U.S. PATENT DOCUMENTS

| | | | | |
|---|---|---|---|---|
| 2009/0284550 | A1* | 11/2009 | Shimada | G06F 30/15 |
| | | | | 345/441 |
| 2014/0098094 | A1* | 4/2014 | Neumann | G06V 20/653 |
| | | | | 345/420 |
| 2015/0231431 | A1* | 8/2015 | Sandahl | A62C 37/36 |
| | | | | 700/283 |
| 2015/0381968 | A1* | 12/2015 | Arora | G06T 17/00 |
| | | | | 348/47 |
| 2016/0171765 | A1* | 6/2016 | Mehr | G06T 17/20 |
| | | | | 345/419 |
| 2016/0292978 | A1* | 10/2016 | Lee | H04W 4/06 |
| 2018/0211512 | A1* | 7/2018 | Zribi | G08B 7/06 |
| 2018/0227141 | A1* | 8/2018 | Zribi | H04L 12/2827 |
| 2018/0315237 | A1* | 11/2018 | Byers | G06T 19/00 |
| 2019/0026958 | A1* | 1/2019 | Gausebeck | H04N 13/10 |
| 2022/0108047 | A1* | 4/2022 | Cheng | G06F 30/27 |
| 2022/0252906 | A1* | 8/2022 | Schwarz | G06F 30/10 |

OTHER PUBLICATIONS

Notice Of Allowance(CN202310337386.4); Date of Mailing: Aug. 17, 2023.
Hybrid-Reliability-Based-Design-Optimization-of-Complex-Structures-With-Random-and-Interval-Uncertainties-Based-on-ASS-HRA.

* cited by examiner

DIFFERENCE ANALYSIS METHOD FOR 3D CAD MODELS BASED ON KEY-POINT MATCHING

CROSS-REFERENCE TO RELATED APPLICATIONS

The present application claims priority to Chinese Patent Application No. 202310337386.4, filed on Mar. 31, 2023, the content of which is incorporated herein by reference in its entirety.

TECHNICAL FIELD

The present disclosure relates to the field of difference analysis of 3D CAD models, in particular to a difference analysis method for 3D CAD models based on key-point matching.

BACKGROUND

CAD technology is widely applied in digital design and intelligent manufacturing. In the iterative update of a product from the initial version to the final version, it is necessary to constantly modify and optimize its 3D CAD models. Thus it is very important to identify the changes of CAD models accurately and quickly between different versions to ensure production efficiency and product quality. Additionally, the difference analysis method for 3D CAD models is also widely used in the retrieval and reuse of models, management of product information and exchange of product data. However, the existing difference analysis methods for CAD models are non-universal because they require the models to be created in the same way or cannot identify the differences between two models in different coordinate systems.

SUMMARY

In view of the problem that existing difference analysis methods for 3D CAD models are not universal or robust, the present disclosure provides a difference analysis method for 3D CAD models based on key-point matching. According to the method, the 3D CAD models are firstly transformed into a key-point representation, then a graph representation and a graph matching method are introduced to pre-match the vertices of two 3D CAD models, and parameters of rigid transformation between the two 3D CAD models are obtained through a mismatch elimination method; and subsequently, a matching relationship of key-points is established by checking their distance after rigid transformation to obtain a key-point matching sequence for hierarchical comparison, thereby the difference between the 3D CAD models can be identified quickly and accurately by analyzing the differences between their vertices, edges, faces and solid models.

The objective of the present disclosure is achieved through the following technical solution: a difference analysis method for 3D CAD models based on key-point matching, including the following steps:

S1, transforming two 3D CAD models to be compared into an STP format.

S2, extracting three kinds of key-points, namely vertices, edge control points and face control points, from the 3D CAD models.

Extracting intersections of edges from the 3D CAD models as the vertices, and recording the 3D coordinates of the vertices.

Transforming the edges of the 3D CAD models into a form of Non-Uniform Rational B-Spline (NURBS) curves, and taking NURBS control points except the vertices extracted from each edge as edge control points of the 3D CAD models, and recording 3D coordinates and weights of the edge control points.

Transforming the faces of the 3D CAD models into a NURBS form, and taking the NURBS control points except the vertices extracted from each face as the face control points of the 3D CAD models, and recording the 3D coordinates and weights of the face control points.

S3, transforming the 3D CAD models into graph representation forms for vertex pre-matching, each face of the 3D CAD models corresponds to one node of a graph, and when two faces in the 3D CAD models share a common edge, there is one link between the two nodes in the graph, corresponding to the common edge of the two faces, otherwise there is no link between the two nodes.

S4, calculating a similarity between the nodes and a similarity between the links of two graphs, which includes the following sub-steps:

S4.1, uniformly sampling on a model face corresponding to a node by a NURBS representation:

$$\{l_n^i\} = \left\{S_i(0,0), S_i\left(0, \frac{1}{N_1-1}\right), S_i\left(0, \frac{2}{N_1-1}\right), \ldots, \right.$$
$$\left. S_i(0,1), S_i\left(\frac{1}{N_1-1}, 0\right), S_i\left(\frac{1}{N_1-1}, \frac{1}{N_1-1}\right), \ldots, S_i(1,1)\right\}$$

where $\{l_n^i\}$ is a set of sampling points of an $i^{th}$ node $G_i$, n=1, ..., $N_1 \times N_1$, $N_1$ is a sampling number, $S_i(u,v)$ is a sampling point on the model face S, corresponding to the node $G_i$ obtained by the NURBS representation.

Uniformly sampling on a model edge corresponding to a link by a NURBS representation:

$$\{l_m^{ij}\} = \left\{C_{ij}(0), C_{ij}\left(\frac{1}{N_2-1}\right), C_{ij}\left(\frac{2}{N_2-1}\right), \ldots, C_{ij}(1)\right\}$$

where $\{l_m^{ij}\}$ is a set of sampling points of a link $G_{ij}$ between the $i^{th}$ node and a $j^{th}$ node, m=1, ..., $N_2$, $N_2$ is a sampling number, $C_{ij}(u)$ is a sampling point obtained from the NURBS representation of a model edge $C_{ij}$ corresponding to the link $G_{ij}$.

S4.2, calculating an average matching distance error of two point sets based on rigid transformation. For two point sets $\{p_k\}$ and $\{q_k\}$ with a same number of points, an optimal rigid transformation can be found:

$$(R^*, T^*) = \operatorname*{argmin} \sum_{k=1}^{K} \|(R \cdot p_k + T) - q_k\|^2$$

where K is a number of points in the point sets, R* and T* are an optimal rotation matrix and an optimal translation matrix respectively, $p_k$ and $q_k$ are the 3D coordinates of the $k^{th}$ point in the two point sets $\{p_k\}$ and $\{q_k\}$, respectively, and a solution is:

$$R^* = V \begin{pmatrix} 1 & & & & \\ & 1 & & & \\ & & \ddots & & \\ & & & 1 & \\ & & & & \det(VU^T) \end{pmatrix} U^T$$

$$T^* = \bar{q} - R^* \bar{p}$$

where, $$\bar{p} = \frac{1}{K}\sum_{k=1}^{K} p_k, \text{ and } \bar{q} = \frac{1}{K}\sum_{k=1}^{K} q_k;$$

U and V are singular value decompositions of a covariance matrix $S_c$, $S_c = XY^T$, X and Y comprise column vectors $x_k = p_k - \bar{p}$ and $y_k = q_k - \bar{q}$, respectively, k=1, 2, ..., K.

After obtaining the optimal rotation matrix and the optimal translation matrix, calculating the average matching distance error as follows:

$$E(\{p_k\}, \{q_k\}) = \frac{1}{K}\sqrt{\sum_k \|(R^* \cdot p_k + T^*) - q_k\|^2}$$

S4.3, calculating the similarity between the nodes and the similarity between the links based on the average matching distance error of the two point sets, respectively.

The similarity between two nodes $G_i$ and $G'_{i'}$ in two graphs G and G' is:

$$S^{node}(G_i, G'_{i'}) = e^{-E(\{l_n^i\}, \{l'_n{}^{i'}\})}$$

where $\{l_n^i\}$ is a set of sampling points of the node $G_i$ in a graph G, and $\{l'_n{}^{i'}\}$ is a set of sampling points of a node $G'_{i'}$ in a graph G'.

The similarity between two links $G_{ij}$ and $G'_{i'j'}$ in two graphs G and G' is:

$$S^{link}(G_{ij}, G'_{i'j'}) = e^{-E(\{l_m^{ij}\}, \{l'_m{}^{i'j'}\})}$$

where $\{l_m^{ij}\}$ is a set of sampling points of the link $G_{ij}$ in the graph G, and $\{l'_m{}^{i'j'}\}$ is a set of sampling points of a link $G'_{i'j'}$ in the graph G'.

S5, pre-matching the vertices of the two 3D CAD models by using a graph matching method, and defining a matching matrix M of the two graphs G and G', an element $m_{ii'}$ is 1 when the node $G_i$ of the graph G is matched with the node $G'_{i'}$ of the graph G', otherwise the element $m_{ii'}$ is 0; and finding an optimal matching matrix M* to maximize a total similarity.

$$M^* = \arg\max_M \left( \sum_{ii'} m_{ii'} \cdot S^{node}(G_i, G'_{i'}) + \sum_{ii'}\sum_{jj'} m_{ii'} \cdot m_{jj'} \cdot S^{link}(G_{ij}, G'_{i'j'}) \right)$$

Solving M* by an integer projected fixed point method to obtain a node matching result of the two graphs, the faces on the 3D CAD models corresponding to the two nodes matched in the graphs are pre-matched faces; when all the faces adjacent to two edges are correspondingly pre-matched, the two edges are pre-matched edges, and when all the edges adjacent to two vertices are correspondingly pre-matched, the two vertices are pre-matched vertices.

S6, calculating a rigid transformation between the 3D CAD models by a mismatch elimination method. First, calculating the average matching distance error of a set of pre-matched vertices after giving a maximum allowable modeling error ε, if the average matching distance error is smaller than the maximum allowable modeling error ε, then the calculated optimal rotation matrix and the optimal translation matrix are the rigid transformation matrices $R^M$ and $T^M$ between the 3D CAD models; otherwise, calculating a matching distance error of each pair of the pre-matched vertices, respectively:

$$E_k(\{p_k\}, \{q_k\}) = \|(R^* \cdot p_k + T^*) - q_k\|$$

where $E_k(\{p_k\}, \{q_k\})$ is the matching distance error of the $k^{th}$ pair of pre-matched vertices in the point sets $\{p_k\}$ and $\{q_k\}$, $p_k$ and $q_k$ are the 3D coordinates of the $k^{th}$ pair of pre-matched vertices in the point sets $\{p_k\}$ and $\{q_k\}$.

After eliminating a vertex pair with the maximum matching distance error from the sets of pre-matched vertices, recalculating the average matching distance error and comparing it with the maximum allowable modeling error E until the rigid transformation parameters $R^M$ and $T^M$ between the 3D CAD models are solved.

S7, matching the three kinds of key-points, namely the vertices, the edge control points and the face control points, substituting the rigid transformation parameters $R^M$ and $T^M$ into every pair of the vertices of the two 3D CAD models, and calculating the matching distance error:

$$e_{ii'}{}^v = \|R^M \cdot p_i^v + T^M - q_{i'}^v\|$$

where $p_i^v$ and $q_{i'}^v$ are the 3D coordinates of the $i^{th}$ vertex and the $i'^{th}$ vertex in vertex sets $\{p_i^v\}$ and $\{q_{i'}^v\}$ of the two 3D CAD models; and when the obtained $e_{ii'}{}^v$ is smaller than the maximum allowable modeling error ε, the two corresponding vertices are matched vertices.

Substituting the rigid transformation parameters $R^M$ and $T^M$ into every pair of the edge control points, and calculating the matching distance error:

$$e_{ii'}{}^e = \|R^M \cdot p_i^e + T^M - q_{i'}^e\| + \|w(p_i^e) - w(q_{i'}^e)\|$$

where $p_i^e$ and $q_{i'}^e$ are 3D coordinates of the i edge control point and the $i'^{th}$ edge control point in edge control point sets $\{p_i^e\}$ and $\{q_{i'}^e\}$ of the two 3D CAD models, $w(p_i^e)$ and $w(q_{i'}^e)$ are weights of the corresponding edge control points; if the obtained e is smaller than the maximum allowable modeling error ε, the two corresponding edge control points are matched edge control points.

Substituting the rigid transformation parameters $R^M$ and $T^M$ into each pair of face control points, and calculating the matching distance error:

$$e_{ii'}{}^f = \|R^M \cdot p_i^f + T^M - q_{i'}^f\| + \|w(p_i^f) - w(q_{i'}^f)\|$$

where $p_i^f$ and $q_{i'}^f$ are 3D coordinates of the $i^{th}$ face control point and the $i'^{th}$ face control point in face control point sets $\{p_i^f\}$ and $\{q_{i'}^f\}$ of the two 3D CAD models, $w(p_i^f)$ and $w(q_{i'}^f)$ are weights of the corresponding face control points; and when the obtained $e_{ii'}{}^f$ is smaller than the maximum allowable modeling error ε, the two corresponding face control points are matched face control points.

S8, analyzing differences of the 3D CAD models hierarchically; when all the vertices and the edge control points of every two edges on the two 3D CAD models are matched correspondingly, the two edges are considered identical edges, otherwise the two edges are considered different edges; when all the face control points of every two faces on the two 3D CAD models are matched correspondingly and all the constituent edges of every two faces on the two 3D CAD models are identical edges, the two faces are considered identical faces, otherwise the two faces are considered different faces; and when all the faces on the two 3D CAD models are identical faces, the two 3D CAD models are identical models, and otherwise, the two 3D CAD models have differences.

Further, in the S2, a method for acquiring the edge control points specifically includes:

Transforming the edges of the 3D CAD models into a NURBS form, and a curve $\vec{C}(u)$ underlying the edge can be represented as:

$$\vec{C}(u) = \frac{\sum_{i=1}^{n} N_{i,k}(u) \cdot w_i \cdot \vec{P}_i}{\sum_{i=1}^{n} N_{i,k}(u) \cdot w_i}$$

where u is a normalized parameter, n is a number of control points of a NURBS curve, k is an order of the NURBS curve, $N_{i,k}(u)$ is an $i^{th}$ k-order B-spline basis function, $\vec{P}_i$ is a 3D coordinate of an $i^{th}$ control point, and $w_i$ is a weight corresponding to the $i^{th}$ control point; then taking all the NURBS control points except the vertices extracted from the each edge as the edge control points of the 3D CAD models, and recording the 3D coordinates and the weights of the edge control points.

Further, in the S2, a method for acquiring the face control points specifically includes:

Transforming the faces of the 3D CAD models into a NURBS form, and a surface $\vec{S}(u,v)$ underlying the faces can be represented as:

$$\vec{S}(u,v) = \frac{\sum_{i=1}^{n}\sum_{j=1}^{m} N_{i,k}(u) \cdot N_{j,l}(v) \cdot w_{i,j} \cdot \vec{P}_{i,j}}{\sum_{i=1}^{n}\sum_{j=1}^{m} N_{i,k}(u) \cdot N_{j,l}(v) \cdot w_{i,j}}$$

where U,V are normalized parameters, n,m are numbers of the control points in two dimensions of a NURBS surface, k, l are orders of the two dimensions of the NURBS surface, $N_{i,k}(u)$ is the $i^{th}$ k-order B-spline basis function, $N_{j,l}(v)$ is an $j^{th}$ l-order B-spline basis function, $\vec{P}_{i,j}$ is a 3D coordinate of the control point at a position (i, j), $w_{i,j}$ is a weight corresponding to the control point at the position (i, j); then taking the NURBS control points except the vertices extracted from each face as the face control points of the 3D CAD models, and recording the 3D coordinates and the weights of the face control points.

Further, after obtaining a difference analysis result of the 3D CAD models, a visualization interface for the difference analysis of the 3D CAD models is developed based on an Open Cascade platform to display the two 3D CAD models in comparison and highlight all different faces of the 3D CAD models.

The method has the beneficial effects that the difference between 3D CAD models in different poses can be quickly and accurately identified with the consideration of modeling errors, and an intuitive difference analysis result can be provided.

DESCRIPTION OF EMBODIMENTS

The object and effect of the present disclosure will become more apparent by describing the present disclosure in detail according to the attached drawings and preferred embodiments. It should be understood that the specific embodiments described here are only for explaining the present disclosure and are not used to limit the present disclosure.

Figure 1:
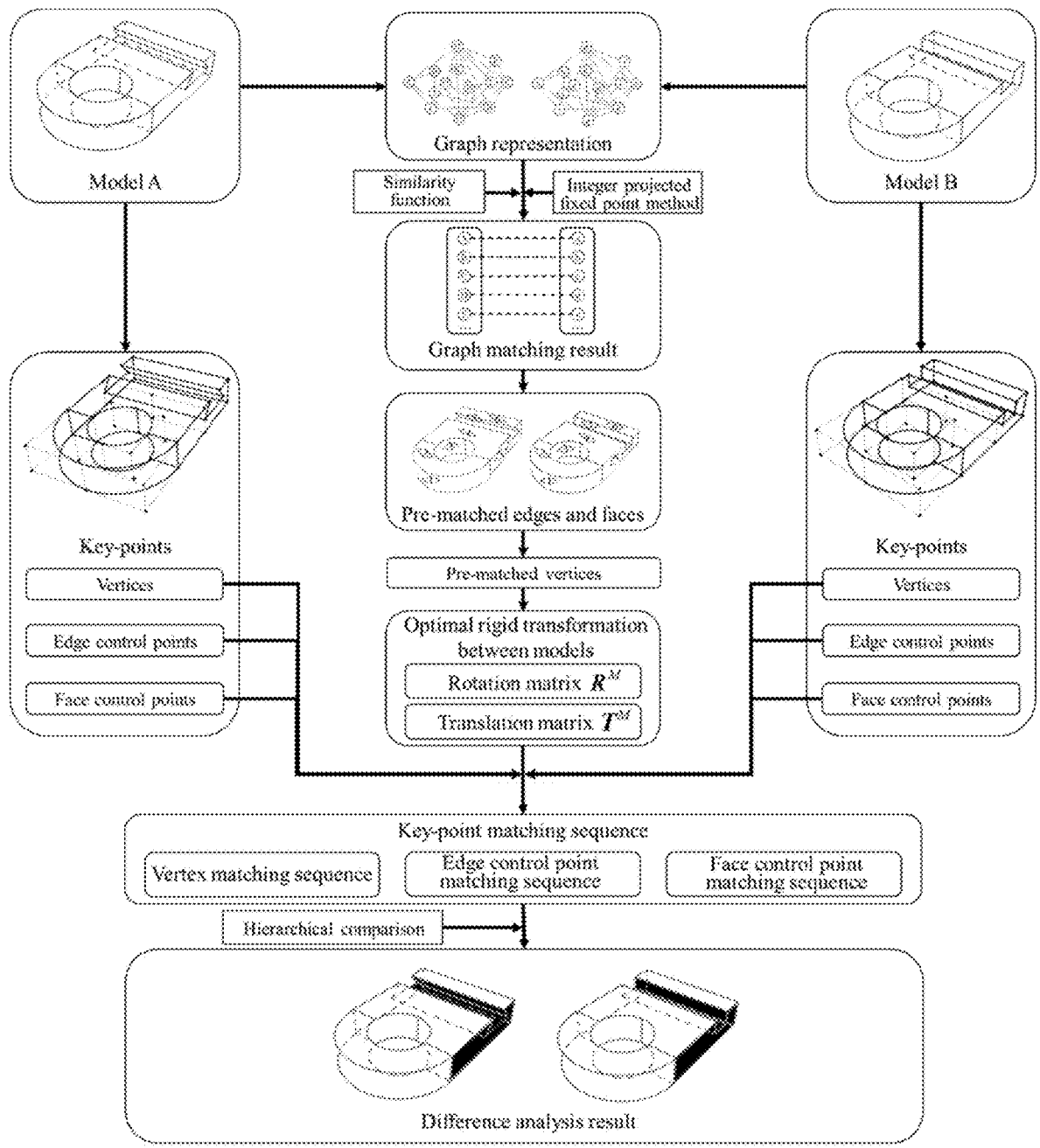
FIG. 1 is a flow chart of the method of the present disclosure.

In the difference analysis method for 3D CAD models based on key-point matching provided by the present disclosure, the 3D CAD model is firstly transformed into a key-point representation, then a graph representation and a graph matching method are introduced to establish a pre-matching of vertices between the two 3D CAD models, and rigid transformation parameters between the two 3D CAD models are obtained through a mismatch elimination method; subsequently, a matching relationship of key-points is established by checking their distance after rigid transformation to obtain a key-point matching sequence for hierarchical comparison, so as to identify the differences between vertices, edges, faces and solid models. The flow chart of the method is shown in FIG. 1, which specifically includes the following steps:

S1, two 3D CAD models to be compared are transformed into the STP format.

S2, three kinds of key-points, namely vertices, edge control points and face control points, are extracted from the 3D CAD models.

Intersections of edges are extracted from the 3D CAD models as the vertices, and the 3D coordinates of the vertices are recorded.

The edges of the 3D CAD models are transformed into the NURBS form, and the curve $\vec{C}(u)$ underlying the edge can be represented as:

$$\vec{C}(u) = \frac{\sum_{i=1}^{n} N_{i,k}(u) \cdot w_i \cdot \vec{P}_i}{\sum_{i=1}^{n} N_{i,k}(u) \cdot w_i}$$

where u is a normalized parameter, n is a number of control points of the NURBS curve, k is an order of the NURBS curve, $N_{i,k}(u)$ is an $i^{th}$ k-order B-spline basis function, $\vec{P}_i$ is the 3D coordinates of the $i^{th}$ control point, and $w_i$ is a weight corresponding to the $i^{th}$ control point; the NURBS control points except the vertices extracted from each edge are taken as the edge control points of the 3D CAD models, and the 3D coordinates and the weights of the edge control points are recorded.

The faces of the 3D CAD models are transformed into the NURBS form, and the surface $\vec{S}(u,v)$ underlying the faces can be represented as:

$$\vec{S}(u,v) = \frac{\sum_{i=1}^{n}\sum_{j=1}^{m} N_{i,k}(u) \cdot N_{j,l}(v) \cdot w_{i,j} \cdot \vec{P}_{i,j}}{\sum_{i=1}^{n}\sum_{j=1}^{m} N_{i,k}(u) \cdot N_{j,l}(v) \cdot w_{i,j}}$$

where u,v are normalized parameters, n,m are numbers of the control points in two dimensions of the NURBS surface, k, l are orders of the two dimensions of the NURBS surface, $N_{i,k}(u)$ is the $i^{th}$ k-order B-spline basis function, $N_{j,l}(v)$ is an $j^{th}$ l-order B-spline basis function, $\vec{P}_{i,j}$ is the 3D coordinate of the control point at a position (i, j), and $w_{i,j}$ is a weight corresponding to the control point at the position (i, j); and the NURBS control points except the vertices extracted from each face are taken as the face control points of the 3D CAD models, and the 3D coordinates and the weights of the face control points are recorded.

S3, the 3D CAD models are transformed into graph representation forms for vertex pre-matching, each face of the 3D CAD models corresponds to one node of a graph, and when two faces in the 3D CAD models share a common edge, there is one link between the two nodes in the graph, corresponding to the common edge of the two faces, otherwise there is no link between the two nodes.

S4, a similarity between the nodes and a similarity between the links of two graphs are calculated, which includes the following sub-steps:

S4.1, uniform sampling is performed on a model face corresponding to a node by a NURBS representation:

$$\{l_n^i\} = \left\{ S_i(0,0), S_i\left(0, \frac{1}{N_1-1}\right), S_i\left(0, \frac{2}{N_1-1}\right), \ldots, \right.$$
$$\left. S_i(0,1), S_i\left(\frac{1}{N_1-1}, 0\right), S_i\left(\frac{1}{N_1-1}, \frac{1}{N_1-1}\right), \ldots, S_i(1,1) \right\}$$

where $\{l_n^i\}$ is a set of sampling points of an $i^{th}$ node $G_i$, n=1, ..., $N_1 \times N_1$, $N_1$ is a sampling number, $S_i(u,v)$ is a sampling point on the model face $S_i$ corresponding to the node G obtained by the NURBS.

Uniform sampling is performed on a model edge corresponding to a link by a NURBS representation:

$$\{l_m^{ij}\} = \left\{ C_{ij}(0), C_{ij}\left(\frac{1}{N_2-1}\right), C_{ij}\left(\frac{2}{N_2-1}\right), \ldots, C_{ij}(1) \right\}$$

where $\{l_m^{ij}\}$ is a set of sampling points of a link between the $i^{th}$ node and a $j^{th}$ node, m=1, ..., $N_2$, $N_2$ is a sampling number, $C_{ij}(u)$ is a sampling point obtained from the NURBS representation of a model edge $C_{ij}$ corresponding to the link $G_{ij}$.

S4.2, an average matching distance error of two point sets is calculated based on rigid transformation, for two point sets $\{p_k\}$ and $\{q_k\}$ with a same number of points, an optimal rigid transformation can be found:

$$(R^*, T^*) = \arg\min \sum_{k=1}^{K} \|(R \cdot p_k + T) - q_k\|^2$$

where K is a number of points in the point set, R* and T* are an optimal rotation matrix and an optimal translation matrix respectively, $p_k$ and $q_k$ are the 3D coordinates of the $k^{th}$ point in the two point sets $\{p_k\}$ and $\{q_k\}$ respectively, and a solution is:

$$R^* = V \begin{Bmatrix} 1 & & & \\ & 1 & & \\ & & \ddots & \\ & & & 1 \\ & & & & \det(VU^T) \end{Bmatrix} U^T$$

$$T^* = \bar{q} - R^* \bar{p}$$

where $$\bar{p} = \frac{1}{K}\sum_{k=1}^{K} p_k, \quad \bar{q} = \frac{1}{K}\sum_{k=1}^{K} q_k;$$

U and V are singular value decompositions of a covariance matrix $S_c$, $S_c = XY^T$, X and Y comprise column vectors $x_k = p_k - \bar{p}$ and $y_k = q_k - \bar{q}$, respectively, k=1, 2, ..., K.

After obtaining the optimal rotation matrix and the optimal translation matrix, the average matching distance error is calculated as follows:

$$E(\{p_k\}, \{q_k\}) = \frac{1}{K} \sqrt{\sum_k \|(R^* \cdot p_k + T^*) - q_k\|^2}$$

S4.3, the similarity between the nodes and the similarity between the links are calculated based on the average matching distance error of the two point sets, respectively.

The similarity between two nodes $G_i$ and $G'_{i'}$ in two graphs G and G' is:

$$S^{node}(G_i, G'_{i'}) = e^{-E(\{l_n^i\}, \{l'_n^{i'}\})}$$

where $\{l_n^i\}$ is a set of sampling points of the node $G_i$ in a graph G, and $\{l'_n^{i'}\}$ is a set of sampling points of a node $G'_{i'}$ in a graph G'.

The similarity between two links $G_{ij}$ and $G'_{i'j'}$ in the two graphs G and G' is:

$$S^{link}(G_{ij}, G'_{i'j'}) = e^{-E(\{l_m^{ij}\}, \{l'_m^{i'j'}\})}$$

where $\{l_m^{ij}\}$ is a set of sampling points of the link $G_{ij}$ in the graph G, and $\{l'_m^{i'j'}\}$ is a set of sampling points of a link $G'_{i'j'}$ in the graph G'.

S5, the vertices of the two 3D CAD models are pre-matched by using a graph matching method, and a matching matrix M of the two graphs G and G' is defined, an element $m_{ii'}$ is 1 when the node $G_i$ of the graph G is matched with the node $G'_{i'}$ of the graph G', otherwise the element $m_{ii'}$ is 0; and an optimal matching matrix M* to maximize a total similarity is found, which satisfies:

$$M^* = \arg\max_M \left( \sum_{ii'} m_{ii'} \cdot S^{node}(G_i, G'_{i'}) + \sum_{ii'}\sum_{jj'} m_{ii'} \cdot m_{jj'} \cdot S^{link}(G_{ij}, G'_{i'j'}) \right)$$

M* is solved by an integer projected fixed point method, and a node matching result of the two graphs is obtained; the faces on the 3D CAD models corresponding to the two nodes matched in the graphs are pre-matched faces; when all the faces adjacent to two edges are correspondingly pre-matched, the two edges are pre-matched edges; and when all the edges adjacent to two vertices are correspondingly pre-matched, the two vertices are pre-matched vertices.

S6, a rigid transformation between the 3D CAD models is calculated by a mismatch elimination method; the average matching distance error of a set of pre-matched vertices is calculated after giving the maximum allowable modeling error E, the calculated optimal rotation matrix and the optimal translation matrix are the rigid transformation matrices $R^M$ and $T^M$ between the 3D CAD models when the average matching distance error is smaller than the maximum allowable modeling error ε; otherwise, the matching distance error of each pair of the pre-matched vertices is calculated, respectively:

$$E_k(\{p_k\},\{q_k\})=\|(R^* \cdot p_k + T^*) - q_k\|$$

where $E_k(\{p_k\},\{q_k\})$ is the matching distance error of the $k^{th}$ pair of the pre-matched vertices in the point sets $\{p_k\}$ and $\{q_k\}$, $p_k$ and $q_k$ are the 3D coordinates of the $k^{th}$ pair of the pre-matched vertices in the point sets $\{L_k\}$ and $\{q_k\}$.

After eliminating a vertex pair with the maximum matching distance error from the point sets of the pre-matched vertices, the average matching distance error is recalculated and compared with the maximum allowable modeling error ε until the rigid transformation parameters $R^M$ and $T^M$ between the 3D CAD models are obtained.

S7, the three kinds of key-points, namely the vertices, the edge control points and the face control points, are matched, the rigid transformation parameters $R^M$ and $T^M$ are substituted into every pair of the vertices of the two 3D CAD models, and the matching distance error is calculated.

$$e_{ii'}^v = \|R^M \cdot p_i^v + T^M - q_{i'}^v\|$$

where $p_i^v$ and $q_{i'}^v$ are the 3D coordinates of the $i^{th}$ vertex and the $i'^{th}$ vertex in vertex sets $\{p_i^v\}$ and $\{q_{i'}^v\}$ of the two 3D CAD models; when the matching distance error $e_{ii'}^v$ is smaller than the maximum allowable modeling error ε, the two corresponding vertices are matched vertices.

The rigid transformation parameters $R^M$ and $T^M$ are substituted into every pair of the edge control points, and the matching distance error is calculated:

$$e_{ii'}^v = \|R^M \cdot p_i^v + T^M - q_{i'}^v\|$$

where $p_i^e$ and $q_{i'}^e$ are the 3D coordinates of the $i^{th}$ edge control point and the $i'^{th}$ edge control point in edge control point sets $\{p_i^e\}$ and $\{q_{i'}^e\}$ of the two 3D CAD models, $w(p_i^e)$ and $w(q_{i'}^e)$ are the weights of the corresponding edge control points; and when the matching error $e_{ii'}^e$ is smaller than the maximum allowable modeling error ε, the two corresponding edge control points are matched edge control points.

The rigid transformation parameters $R^M$ and $T^M$ are substituted into each pair of the face control points, and the matching error is calculated:

$$e_{ii'}^f = \|R^M \cdot p_i^f + T^M - q_{i'}^f\| + \|w(p_i^f) - w(q_{i'}^f)\|$$

where $p_i^f$ and $q_{i'}^f$ are the 3D coordinates of the $i^{th}$ face control point and the $i'^{th}$ face control point in the face control point sets $\{p_i^f\}$ and $\{q_{i'}^f\}$ of the two 3D CAD models, $w(p_i^f)$ and $w(q_{i'}^f)$ are the weights of the corresponding face control points; and when the matching error e is smaller than the maximum allowable modeling error ε, the two corresponding face control points are matched face control points.

S8, the differences of the 3D CAD models are analyzed hierarchically; when all the vertices and edge control points of every two edges on the two 3D CAD models are matched correspondingly, the two edges are considered the identical edges, otherwise the two edges are considered the different edges; when all the face control points of every two faces on the two 3D CAD models are matched correspondingly and all the constituent edges of every two faces are the identical edges, the two faces are considered the identical faces, otherwise the two faces are considered the different faces; and when all the faces on the two 3D CAD models are the identical faces, the two 3D CAD models are identical models, otherwise there are differences between the two 3D CAD models.

S9, after obtaining a difference analysis result of the 3D CAD models, a visualization interface for the difference analysis of the 3D CAD models is developed based on the platform of Open Cascade to display the two 3D CAD models in comparison and highlight all the different faces of the 3D CAD models.

The method of the present disclosure will be described with reference to specific embodiments.

Figure 2:
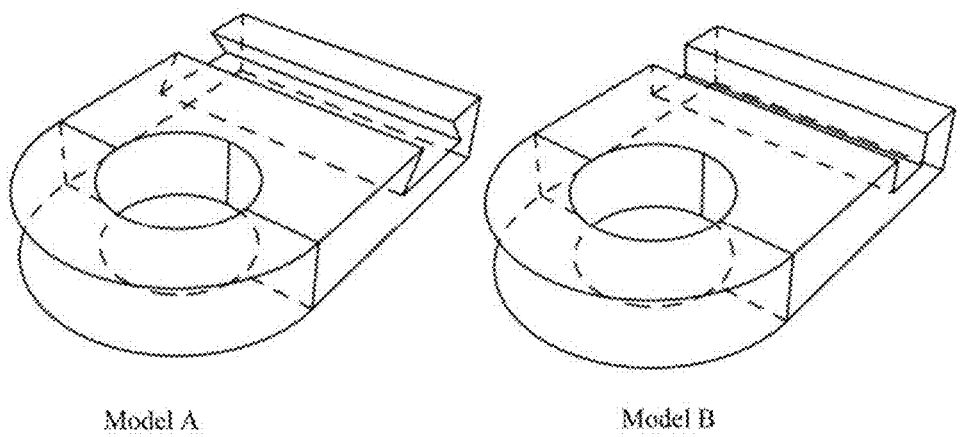
FIG. 2 is two examples of 3D CAD models to be compared.

Two specific 3D CAD models are selected for difference analysis. As shown in FIG. 2, the two 3D CAD models to be compared are both parts with a hole and a slot, the slot of Model A is trapezoidal and the slot of Model B is rectangular, and there is no other difference between the two 3D CAD models.

S1, two 3D CAD models to be compared are transformed into the STP format.

Figure 3:
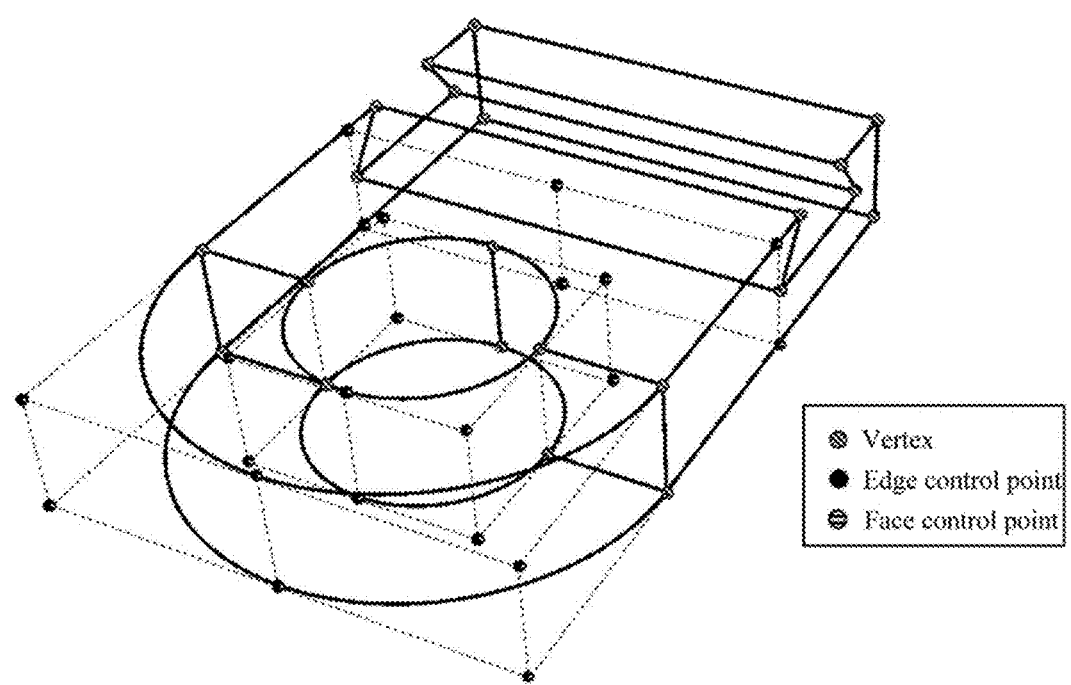
FIG. 3 is a schematic diagram of extracting key-points from a 3D CAD model.

S2, the key-points are extracted from the two 3D CAD models, respectively; FIG. 3 is a schematic diagram of the key-points of Model A; both the models are composed of two cylindrical faces and 11 planes, with 22 vertices, 22 edge control points and 22 face control points.

Figure 4:
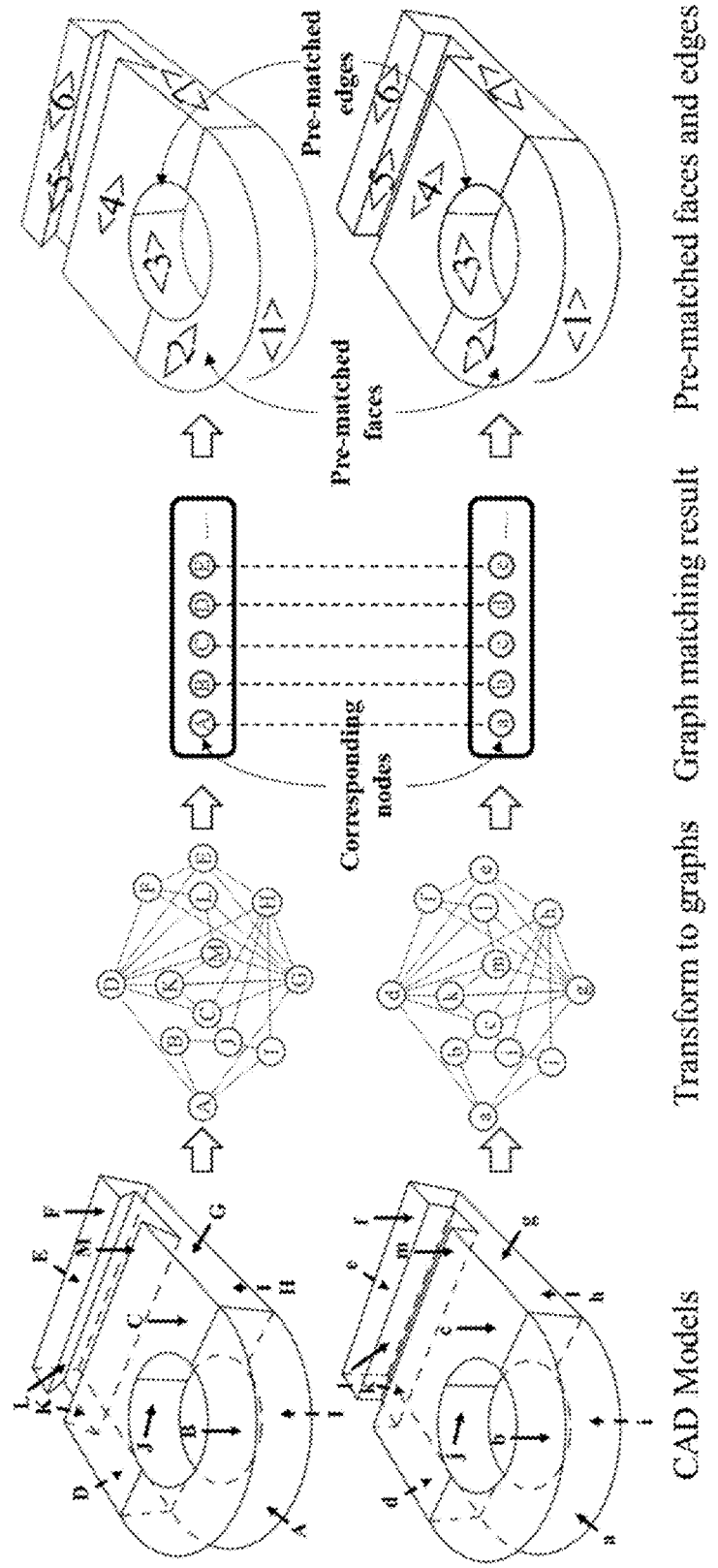
FIG. 4 is a schematic diagram of pre-matching vertices, edges and faces of the 3D CAD models by graph representation and graph matching.

S3, the 3D CAD models is transformed into a graph representation, as shown in FIG. 4, each node of a graph corresponds to a face on a model, and each link between the nodes corresponds to a common edge of two faces on a model.

S4, the similarities between the nodes and the links of the two graphs are calculated.

S5, an IPFP (Integer Projected Fixed Point) Method is used to obtain the graph matching result, and as shown in FIG. 4, the pre-matched faces, edges and vertices are obtained based on the graph matching result.

S6, the rigid transformation between the 3D CAD models is calculated by a mismatch elimination method, and for a given maximum allowable modeling error ε, the calculated average matching distance error of the pre-matched vertex set is greater than maximum allowable modeling error, therefore the average matching distance error are recalculated iteratively after eliminating the vertex pair with the largest matching distance error until the average matching distance error is smaller than the maximum allowable modeling error, and the rigid transformation parameters between the 3D CAD models are calculated:

$$R^M = \begin{bmatrix} 0.8823 & 0 & 0.4706 \\ 0 & -1 & 0 \\ 0.4706 & 0 & 0.8823 \end{bmatrix}, T^M = \begin{bmatrix} 0.3794 \\ 0.2392 \\ 0.4460 \end{bmatrix}.$$

S7, matching vertices, edge control points and face control points, substituting the obtained rigid transformation parameters into each pair of vertices, edge control points and face control points, and calculating the matching error, so as to match 14 pairs of vertices, 22 pairs of edge control points and 22 pairs of face control points.

Figure 5:
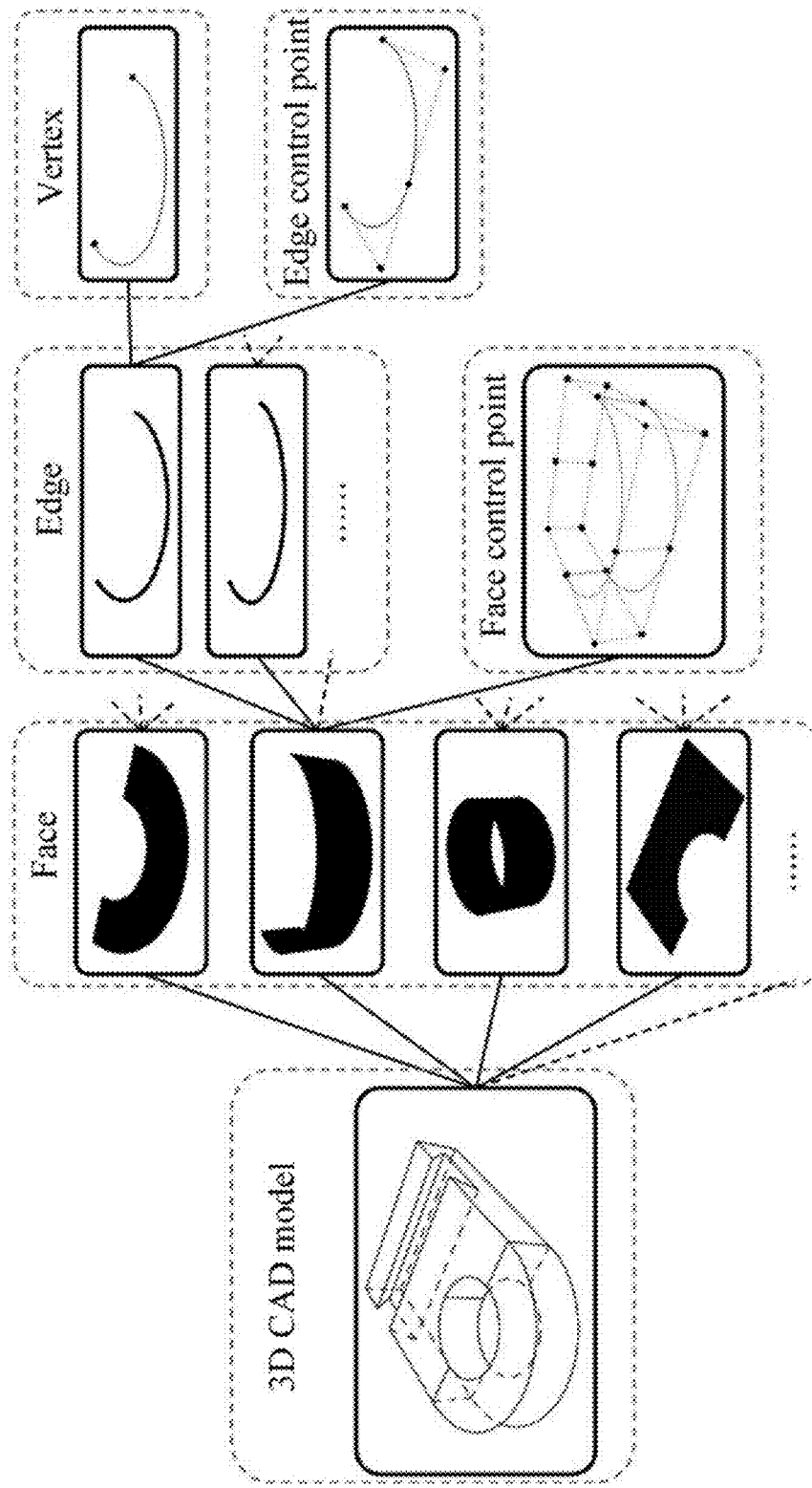
FIG. 5 is a schematic diagram of the hierarchical composition of the 3D CAD model.

S8, two 3D CAD models are compared hierarchically; FIG. 5 is the hierarchical composition of Model A; when comparing the edges of the two 3D CAD models, if all vertices and edge control points contained therein are matched correspondingly, the two edges are regarded as the identical edges, otherwise, they are regarded as the different edges; there are 17 pairs of identical edges and 10 pairs of different edges on the two 3D CAD models; when comparing the faces of the two 3D CAD models, if all the edges are identical and all the face control points are matched correspondingly, the two faces are regarded as the identical faces, otherwise they are regarded as the different faces; there are 8 pairs of identical faces and 5 pairs of different faces in the two 3D CAD models; due to the existence of different faces between the two 3D CAD models, the two 3D CAD models are considered different.

Figure 6:
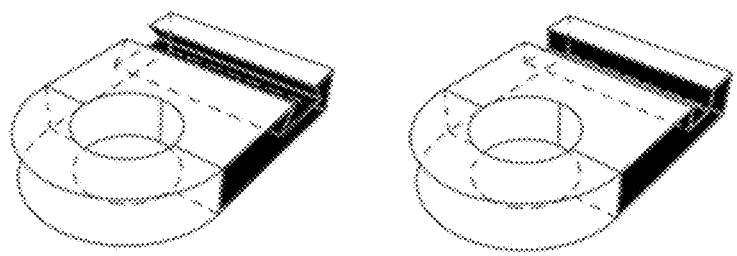
FIG. 6 is a comparison result of a difference analysis example of 3D CAD models.

S9, the comparison result is output, as shown in FIG. 6, and two 3D CAD models are displayed in the software interface, and the different faces are highlighted.

It can be understood by those skilled in the art that the above is only a preferred example of the present disclosure, and it is not used to limit the present disclosure. Although the present disclosure has been described in detail with reference to the above examples, it is still possible for those skilled in the art to modify the technical solution described in the above examples or replace some technical features equally. Any modification and equivalent substitution within the spirit and principle of the present disclosure should be included in the scope of protection of the present disclosure.

What is claimed is:

1. A difference analysis method for 3D CAD models based on key-point matching, comprising:
   step S1, acquiring 3D CAD models from two parts to be compared through a 3D scanner, and transforming the two 3D CAD models to be compared into a STP format;
   step S2, extracting three kinds of key-points, namely vertices, edge control points and face control points, from the 3D CAD models, further comprising:
   extracting intersections of edges from the 3D CAD models as the vertices, and recording 3D coordinates of the vertices;
   transforming the edges of the 3D CAD models into a form of a Non-Uniform Rational B-Spline (NURBS) curve, and taking NURBS control points except the vertices extracted from each of the edges as the edge control points of the 3D CAD models, and recording 3D coordinates and weights of the edge control points;
   transforming faces of the 3D CAD models into a NURBS form, and taking the NURBS control points except the vertices extracted from each face as the face control points of the 3D CAD models, and recording 3D coordinates and weights of the face control points; and
   developing a visualization interface based on an Open Cascade platform to display the extracted three kinds of key-points on the 3D CAD models by using three different formats of markers;
   step S3, transforming the 3D CAD models into graph representation forms for vertex pre-matching, wherein each face of the 3D CAD models corresponds to one node of a graph, and when two faces in the 3D CAD models share a common edge, there is one link between two nodes in the graph, corresponding to the common edge of the two faces, otherwise there is no link between the two nodes;
   step S4, calculating a similarity between nodes and a similarity between links of two graphs, further comprising:
   sub-step S4.1, uniformly sampling on a model face corresponding to a node by a NURBS representation:

$$\{l_n^i\} = \left\{S_i(0, 0), S_i\left(0, \frac{1}{N_1-1}\right), S_i\left(0, \frac{2}{N_1-1}\right), \ldots, \right.$$
$$\left. S_i(0, 1), S_i\left(\frac{1}{N_1-1}, 0\right), S_i\left(\frac{1}{N_1-1}, \frac{1}{N_1-1}\right), \ldots, S_i(1, 1)\right\}$$

where $\{l_n^i\}$ is a set of sampling points of an $i^{th}$ node $G_i$, $n=1, \ldots, N_1 \times N_1$, $N_1$ is a sampling number, $S_i(u,v)$ is a sampling point on a model face $S_i$ corresponding to the node $G_i$ obtained by the NURBS representation;
uniformly sampling on a model edge corresponding to a link by a NURBS representation, namely:

$$\{l_m^{ij}\} = \left\{C_{ij}(0), C_{ij}\left(\frac{1}{N_2-1}\right), C_{ij}\left(\frac{2}{N_2-1}\right), \ldots .C_{ij}(1)\right\}$$

where $\{l_m^{ij}\}$ is a set of sampling points of a link $G_{ij}$ between an $i^{th}$ node and a $j^{th}$ node, $m=1, \ldots, N_2$, $N_2$ is a sampling number, $C_{ij}(u)$ is a sampling point obtained by the NURBS representation of a model edge $C_{ij}$ corresponding to the link $G_{ij}$;
sub-step S4.2, calculating an average matching distance error of two point sets based on rigid transformation, and finding an optimal rigid transformation for any two point sets $\{p_k\}$ and $\{q_k\}$ with a same number of points by:

$$(R^*, T^*) = \operatorname{argmin}\sum_{k=1}^{K}\|(R \cdot p_k + T) - q_k\|^2$$

where K is a number of points in the point sets, R* and T* are an optimal rotation matrix and an optimal translation matrix, respectively, $p_k$ and $q_k$ are 3D coordinates of a $k^{th}$ point in the two point sets $\{p_k\}$ and $\{q_k\}$, respectively, and a solution of R* and T* is:

$$R^* = V\begin{Bmatrix} 1 & & & & \\ & 1 & & & \\ & & \ddots & & \\ & & & 1 & \\ & & & & \det(VU^T) \end{Bmatrix}U^T$$

$$T^* = \bar{q} - R^*\bar{p}$$

where $$\bar{p} = \frac{1}{K}\sum_{k=1}^{K}p_k, \text{ and } \bar{q} = \frac{1}{K}\sum_{k=1}^{K}q_k;$$

U and V are singular value decompositions of a covariance matrix $S_c$, $S_c=XY^T$, where X and Y comprise column vectors $x_k=p_k-\bar{p}$ and $y_k=q_k-\bar{q}$, respectively, k=1, 2, . . . ,K; and calculating, after obtaining the optimal rotation matrix and the optimal translation matrix, an average matching distance error as follows:

$$E(\{p_k\}, \{q_k\}) = \frac{1}{K}\sqrt{\sum_k\|(R^*\cdot p_k + T^*) - q_k\|^2}$$

sub-step S4.3, calculating the similarity between the nodes and the similarity between the links, respectively, based on the average matching distance error of the two point sets;

wherein the similarity between two nodes $G_i$ and $G'_{i'}$ in two graphs G and G' is:

$$S^{node}(G_i, G'_{i'})=e^{-E(\{l_n^i\},\{l'_n{}^{i'}\})}$$

where $\{l_n^i\}$ is a set of sampling points of the node $G_i$ in a graph G, and $\{l'_n{}^{i'}\}$ is a set of sampling points of a node $G'_{i'}$ in a graph G';

wherein the similarity between two links $G_{ij}$ and $G'_{i'j'}$ in the two graphs G and G' is:

$$S^{link}(G_{ij},G'_{i'j'})=e^{-E(\{l_m^{ij}\},\{l'_m{}^{i'j'}\})}$$

where $\{l_m^{ij}\}$ is a set of sampling points of the link $G_{ij}$ in the graph G, and $\{l'_m{}^{i'j'}\}$ is a set of sampling points of a link $G'_{i'j'}$ in the graph G';

step S5, pre-matching the vertices of the two 3D CAD models by using a graph matching method, and defining a matching matrix M of the two graphs G and G', wherein an element $m_{ii'}$ is 1 when the node $G_i$ of the graph G is matched with the node $G'_{i'}$ of the graph G', and otherwise the element $m_{ii'}$ is 0;

finding an optimal matching matrix M* to maximize a total similarity:

$$M^* = \arg\max_M\left(\sum_{ii'} m_{ii'}\cdot S^{node}(G_i, G'_{i'}) + \sum_{ii'}\sum_{jj'} m_{ii'}\cdot m_{jj'}\cdot S^{link}(G_{ij}, G'_{i',j'})\right)$$

solving M* by an integer projected fixed point method to obtain a node matching result of the two graphs G and G', wherein faces on the 3D CAD models corresponding to the two nodes matched in the graphs are pre-matched faces, and wherein when all the faces adjacent to two edges are correspondingly pre-matched, the two edges are pre-matched edges, and when all the edges adjacent to two vertices are correspondingly pre-matched, the two vertices are pre-matched vertices;

step S6, calculating a rigid transformation between the 3D CAD models by a mismatch elimination method, calculating the average matching distance error of a set of pre-matched vertices after giving a maximum allowable modeling error ε, wherein the optimal rotation matrix and the optimal translation matrix are rigid transformation matrices $R^M$ and $T^M$ between the 3D CAD models when the average matching distance error is smaller than the maximum allowable modeling error ε; otherwise, calculating a matching distance error of each pair of the pre-matched vertices, respectively:

$$E_k(\{p_k\},\{q_k\})=\|(R^*\cdot p_k+T^*)-q_k\|$$

where $E_k(\{p_k\},\{q_k\})$ is the matching distance error of a $k^{th}$ pair of the pre-matched vertices in the point sets $\{p_k\}$ and $\{q_k\}$, $p_k$ and $q_k$ are 3D coordinates of the $k^{th}$ pair of the pre-matched vertices in the point sets $\{p_k\}$ and $\{q_k\}$;

recalculating the average matching distance error after eliminating a vertex pair with the maximum matching distance error from the sets of pre-matched vertices, and comparing the average matching distance error with the maximum allowable modeling error ε until the rigid transformation parameters $R^M$ and $T^M$ between the 3D CAD models are solved;

step S7, matching the three kinds of key-points, namely the vertices, the edge control points and the face control points, substituting the rigid transformation parameters $R^M$ and $T^M$ into every pair of the vertices of the two 3D CAD models, and calculating a matching distance error;

$$e_{ii'}{}^v=\|R^M\cdot p_i^v+T^M-q_{i'}{}^v\|$$

where $p_i^v$ and $q_{i'}{}^v$ are 3D coordinates of an $i^{th}$ vertex and an $i'^{th}$ vertex in vertex sets $\{p_i^v\}$ and $\{q_{i'}{}^v\}$ of the two 3D CAD models; and when the matching distance error $e^{ii'v}$ is smaller than the maximum allowable modeling error ε, the two corresponding vertices are matched vertices;

substituting the rigid transformation parameters $R^M$ and $T^M$ into each pair of edge control points, and calculating the matching distance error, respectively:

$$e_{ii'}{}^e=\|R^M\cdot p_i^e+T^M-q_{i'}{}^e\|+\|w(p_i^e)-w(q_{i'}{}^e)\|$$

where $p_i^e$ and $q_{i'}{}^e$ are 3D coordinates of an $i^{th}$ edge control point and an $i'^{th}$ edge control point in edge control point sets $\{p_i^e\}$ and $\{q_{i'}{}^e\}$ of the two 3D CAD models, $w(p_i^e)$ and $w(q_{i'}{}^e)$ are weights of the corresponding edge control points $p_i^e$ and $q_{i'}{}^e$; and when the matching distance error $e_{ii'}{}^e$ is smaller than the maximum allowable modeling error ε, the two corresponding edge control points are matched edge control points;

substituting the rigid transformation parameters $R^M$ and $T^M$ into each pair of face control points, and calculating the matching distance error, respectively:

$$e_{ii'}{}^f=\|R^M\cdot p_i^f+T^M-q_{i'}{}^f\|+\|w(p_i^f)-w(q_{i'}{}^f)\|$$

where $p_i^f$ and $q_{i'}{}^f$ are 3D coordinates of an $i^{th}$ face control point and an $i'^{th}$ face control point in face control point sets $\{p_i^f\}$ and $\{q_{i'}{}^f\}$ of the two 3D CAD models, $w(p_i^f)$ and $w(q_{i'}{}^f)$ are weights of the corresponding face control points $p_i^f$ and $q_{i'}{}^f$; and when the matching error $e_{ii'}{}^f$ is smaller than the maximum allowable modeling error ε, the two corresponding face control points are matched face control points; and step S8, analyzing differences of the 3D CAD models hierarchically, wherein when all the vertices and the edge control points of every two edges on the two 3D CAD models are matched correspondingly, the two edges are considered identical edges, otherwise the two edges are considered different edges; when all the face control points of every two faces on the two 3D CAD models are matched correspondingly and all constituent edges of every two faces on the two 3D CAD models are identical edges, the two faces are considered identical faces, otherwise the two faces are considered different faces; and when all the faces on the two 3D CAD models are identical faces, the two 3D CAD models are identical, and otherwise, the two 3D CAD models have differences; and step S9: outputting an obtained difference analysis result of the 3D CAD models to the visualization interface developed based on the Open Cascade platform, importing and displaying the two 3D CAD models to be compared, and highlighting all different faces of the two 3D CAD models to visually display the difference analysis result of the 3D CAD models;

step S10: classifying the two parts based on the difference analysis result of the 3D CAD models, when there being no differences between the two parts, classifying the two parts as a same version, otherwise, classifying the two parts as different versions, so as to provide parts of correct version during assembly.

2. The method according to claim 1, wherein in the step S2, a method for acquiring the edge control points specifically comprises:

transforming the edges of the 3D CAD models into a NURBS form, and a curve $\vec{C}(u)$ underlying the edge can be represented as:

$$\vec{C}(u) = \frac{\sum_{i=1}^{n} N_{i,k}(u) \cdot w_i \cdot \vec{P}_i}{\sum_{i=1}^{n} N_{i,k}(u) \cdot w_i}$$

where u is a normalized parameter, n is a number of control points of a NURBS curve, k is an order of the NURBS curve, $N_k(u)$ is an $i^{th}$ k-order B-spline basis function, $\vec{P}_i$ is a 3D coordinate of the $i^{th}$ control point, and $w_i$ is a weight corresponding to the $i^{th}$ control point; and taking the NURBS control points except the vertices extracted from the each edge as the edge control points of the 3D CAD models, and recording the 3D coordinates and the weights of the edge control points.

3. The method according to claim 1, wherein in the step S2, a method for acquiring the face control points comprises:

transforming the faces of the 3D CAD models into the NURBS form, and a surface $\vec{S}(u,v)$ underlying the faces can be represented as:

$$\vec{S}(u, v) = \frac{\sum_{i=1}^{n} \sum_{j=1}^{m} N_{i,k}(u) \cdot N_{j,l}(v) \cdot w_{i,j} \cdot \vec{P}_{i,j}}{\sum_{i=1}^{n} \sum_{j=1}^{m} N_{i,k}(u) \cdot N_{j,l}(v) \cdot w_{i,j}}$$

where u, v are normalized parameters, n,m are numbers of control points in two dimensions of a NURBS surface, k, l are orders of the two dimensions of the NURBS surface, $N_{i,k}(u)$ is an $i^{th}$ k-order B-spline basis function, $N_{j,l}(v)$ is an $j^{th}$ l-order B-spline basis function, $\vec{P}_{i,j}$ is a 3D coordinate of a control point at a position (i, j), and $w_{i,j}$ is a weight corresponding to the control point at the position (i, j); and taking the NURBS control points except the vertices extracted from each face as the face control points of the 3D CAD models, and recording the 3D coordinates and the weights of the face control points.

* * * * *